(12) United States Patent
Hotaka

(10) Patent No.: US 6,349,057 B2
(45) Date of Patent: Feb. 19, 2002

(54) READ PROTECTION CIRCUIT OF NONVOLATILE MEMORY

(75) Inventor: Kazuo Hotaka, Saitama (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/892,984

(22) Filed: Jun. 27, 2001

(30) Foreign Application Priority Data

Jun. 29, 2000 (JP) ........................................ 2000-196428

(51) Int. Cl.$^7$ ............................................... G11C 16/04
(52) U.S. Cl. ............................... 365/185.04; 365/185.09
(58) Field of Search ........................ 365/185.04, 185.09

(56) References Cited

U.S. PATENT DOCUMENTS

| | | | | |
|---|---|---|---|---|
| 5,812,446 A | * | 9/1998 | Tailliet | 365/185.04 |
| 6,034,889 A | * | 3/2000 | Mani et al. | 365/185.04 |
| 6,088,262 A | * | 7/2000 | Nasu | 365/185.04 |
| 6,104,634 A | * | 8/2000 | Rochard | 365/185.04 |
| 6,108,235 A | * | 8/2000 | Honma | 365/185.04 |
| 6,266,271 B1 | * | 6/2001 | Kawamura | 365/185.04 |

* cited by examiner

*Primary Examiner*—Trong Phan
(74) *Attorney, Agent, or Firm*—Fish & Richardson P.C.

(57) ABSTRACT

A read protection memory area is formed within the same memory mat as a main memory area, so that the need to dedicatedly provide a dedicated EEPROM cell for storing read protection data and an analog control circuit for writing the read protection data into this EEPROM cell is eliminated and a chip size can be reduced.

5 Claims, 3 Drawing Sheets

READ PROTECTION CIRCUIT OF NONVOLATILE MEMORY

BACKGROUND OF THE INVENTION

The present invention relates to a read protection circuit for nonvolatile memory, and more particularly to a read protection circuit for writing read protection data including information as to whether read protection is provided or not into nonvolatile memory capable of electrically writing and reading and reading out this read protection data and performing read protection control of the nonvolatile memory.

In nonvolatile memory (EEPROM) capable of electrically writing, reading and erasing, there is no need for battery backup and also data can be rewritten electrically, so that the nonvolatile memory has widely been used in applications such as program storage memory of a microcomputer or an IC card.

In a microcomputer with built-in EEPROM, there is a need to ensure security so that a third party cannot have access to user's program data stored in the EEPROM. On the other hand, since a CPU operates based on a command in which program data read from the EEPROM is decoded, the CPU needs to perform readout from the EEPROM naturally.

Thus, in a conventional microcomputer with built-in EEPROM, information as to whether read protection (read inhibition) of the EEPROM is provided or not was written into read protection memory and based on this information, read protection control was performed.

A read protection circuit of a conventional example will be described below with reference to the accompanying drawing. FIG. 4 is a schematic diagram showing a configuration of EEPROM and a peripheral circuit. A memory mat 51 including plural EEPROM memories capable of electrically writing, reading and erasing is constructed of a main memory area 52, a redundancy memory area 53 for replacing a defective memory area occurring in the main memory area, and an inforow memory area 54 for storing various manufacturing information.

Also, numeral 55 is read protection memory for storing read protection data including information as to whether read protection is provided or not, and is provided as dedicated memory in an area physically distant from the memory mat 51 described above.

Then, control is performed whether external output of data from the main memory area 52 is permitted or inhibited (read protection) on the basis of the read protection data read from the read protection memory 55 under predetermined conditions.

However, the read protection memory 55 is dedicatedly provided in an area physically distant from the memory mat 51 on a chip, so that there is the need to dedicatedly provide an analog control circuit such as an analog bias circuit used in data writing and there is a problem that a circuit scale becomes large.

Also, the need to change the number of read protections according to specifications of a type of machine arises. For example, there are an external ROM mode, a flash mode, etc. as a kind of modes for providing read protection. Thus, when a size of the read protection memory 55 is changed, there is a problem that a change in a layout of a chip is difficult since the read protection memory 55 is provided in an area physically distant from the memory mat 51.

SUMMARY OF THE INVENTION

Therefore, an object of the invention is to eliminate the need to dedicatedly provide a control circuit such as an analog bias circuit by forming read protection memory within the same memory mat as a main memory area to reduce a circuit scale or facilitate expansion and reduction of the read protection memory to reduce a chip size.

A redundancy memory circuit of the invention comprises a main memory area including of plural nonvolatile memories capable of electrically writing and reading, a read protection memory area provided within the same memory mat as the main memory area, means for writing read protection data including information as to whether read protection is provided or not into the read protection memory area, means for reading the read protection data stored in the read protection memory area according to a trigger signal, register means for temporarily storing the read protection data read from the read protection memory area, and gate means for setting a data output read from the main memory area in a read protection state according to output data of the register means.

In accordance with such means, the read protection memory area is formed within the same memory mat as the main memory area, so that the need to dedicatedly provide a dedicated EEPROM cell for storing read protection data and an analog control circuit for writing the read protection data into this EEPROM cell is eliminated and a chip size can be reduced.

Also, a size of the read protection memory area can be changed easily, so that memory design according to specifications of a type of machine can be performed in a short time while the chip size can be reduced.

DETAILED DESCRIPTION OF THE PREFERRED EMBODIMENT

Figure 1:
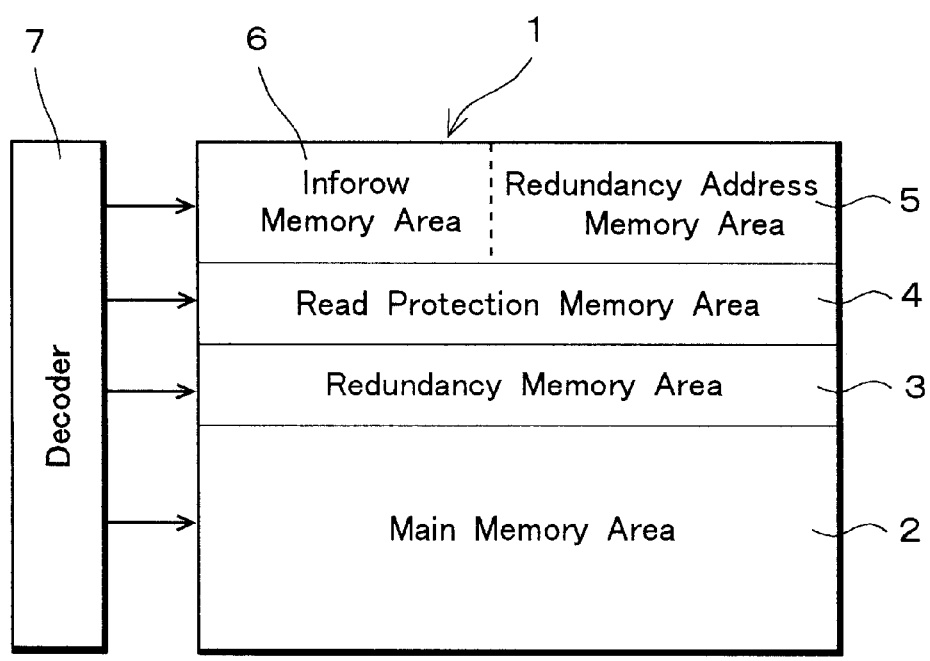
FIG. 1 is a schematic diagram showing a read protection circuit of nonvolatile memory according to an embodiment of the invention.

An embodiment of the invention will be described below with reference to the accompanying drawings. FIG. 1 is a schematic diagram showing a read protection circuit of nonvolatile memory of the invention.

A memory mat 1 including plural EEPROM memories capable of electrically writing, reading and erasing has a redundancy memory area 3 for replacing a defective memory area occurring in a main memory area 2. A read protection memory area 4 into which information as to whether read protection is provided or not is written is provided adjacent to this redundancy memory area 3. That is, read protection data is flag information as to whether read protection is provided or not.

Also, a redundancy address memory area 5 for storing address data of the defective memory area is provided in a part of an inforow memory area 6 within the memory mat 1. The inforow memory area 6 is a memory area for a specified row selected by the address decoder 7, and stores various manufacturing information.

The inforow memory area 6 is constructed accessibly only at the time of a test mode.

Also, the redundancy memory area 3 and the read protection memory area 4 are provided in the same address space as that of the main memory area 2, and are accessed by one address decoder 7. However, this is one example and they may be provided in a separate address space.

Figure 2:
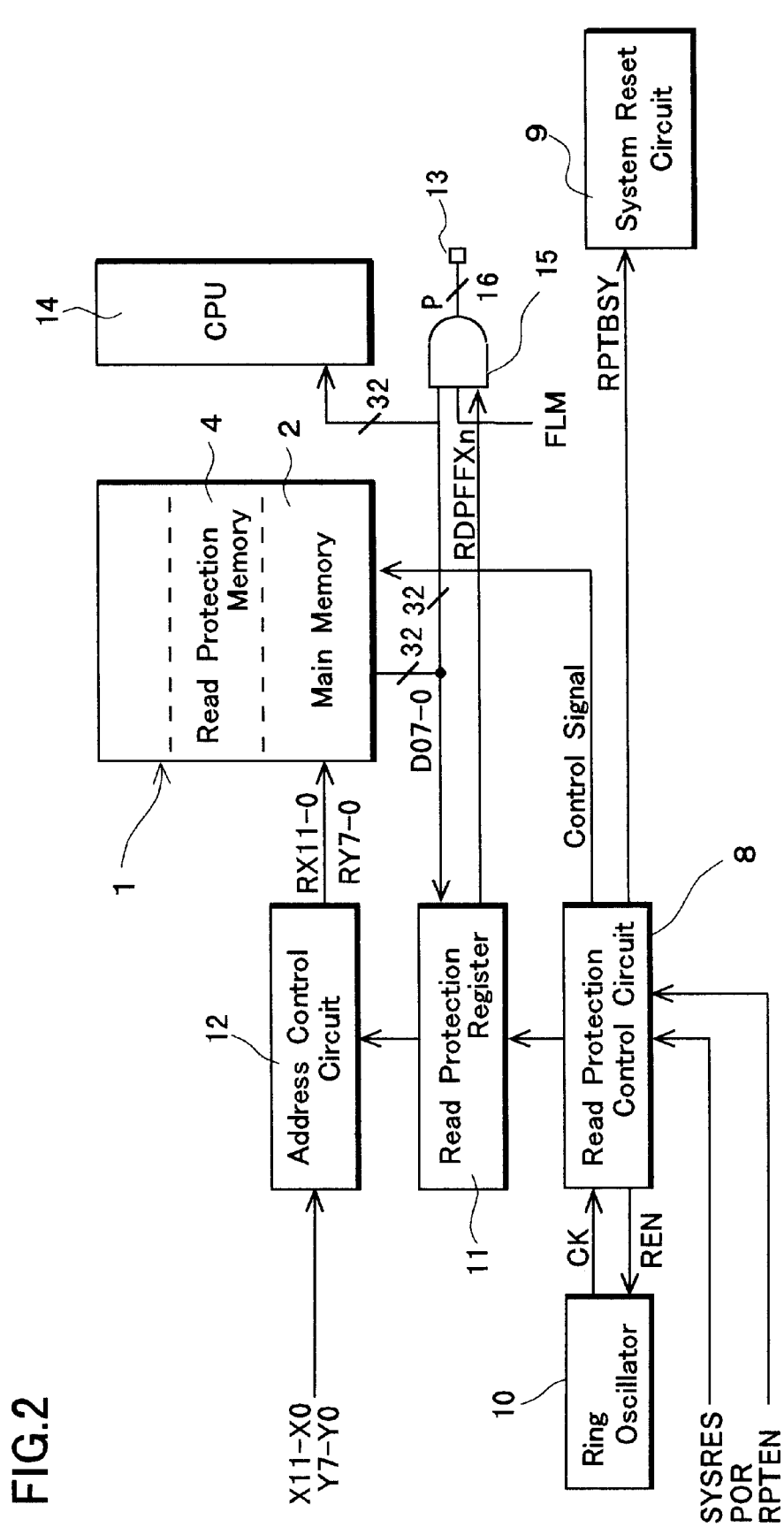
FIG. 2 is a block circuit diagram showing the read protection circuit of the nonvolatile memory according to the embodiment of the invention.

FIG. 2 is a block diagram showing the entire configuration of the read protection circuit of the embodiment. The main memory area 2 has construction of 5M bits as one example. The main memory area 2 is constructed of plural sectors of 320 sectors (1 sector=2 K bytes)

One sector is specified by, for example, word lines extending in a row direction of the memory mat 1 and also is constructed of a memory cell group arranged in a row direction. The main memory area 2 is an area used as, for example, a program storage area of a microcomputer and is integrated with the microcomputer into one chip to function as a so-called microcomputer with built-in EEPROM.

A read protection control circuit 8 detects a system reset signal SYSRES of a microcomputer or a power-on reset signal POR from a voltage detection circuit built in the microcomputer and outputs various control signals described below. Also, a system reset circuit 9 sets the microcomputer in a standby state according to a read protection busy signal RPTBSY outputted by the read protection control circuit 8. A ring oscillator 10 generates a clock used in readout of redundancy address data.

A read protection register 11 temporarily stores read protection data read from the read protection memory area 4. The read protection register comprises, for example, a latch circuit of 8 bits.

An address control circuit 12 is inputted input address data X11-X0 and Y7-Y0 and accesses memory. Also, the address control circuit 12 selects an address of the read protection memory area 4 according to a control signal outputted by the read protection control circuit 8 when a read protection enable signal RPTEN becomes "H". As a result of this, writing of the read protection memory area 4 is enabled.

Data with a width of 32 bits read from the main memory area 2 is outputted to an output port 13 and a CPU 14. Here, a data bus to the CPU 14 is 32 bits, but a data bus to the output port 13 is set at 16 bits due to limitation of the number of output ports.

Numeral 15 is an AND gate provided in the data bus to the output port 13. An output signal RDPFFXn of the read protection register 11, a flash mode signal FLM, and data from the main memory 2 are inputted to the AND gate 15.

Figure 3:
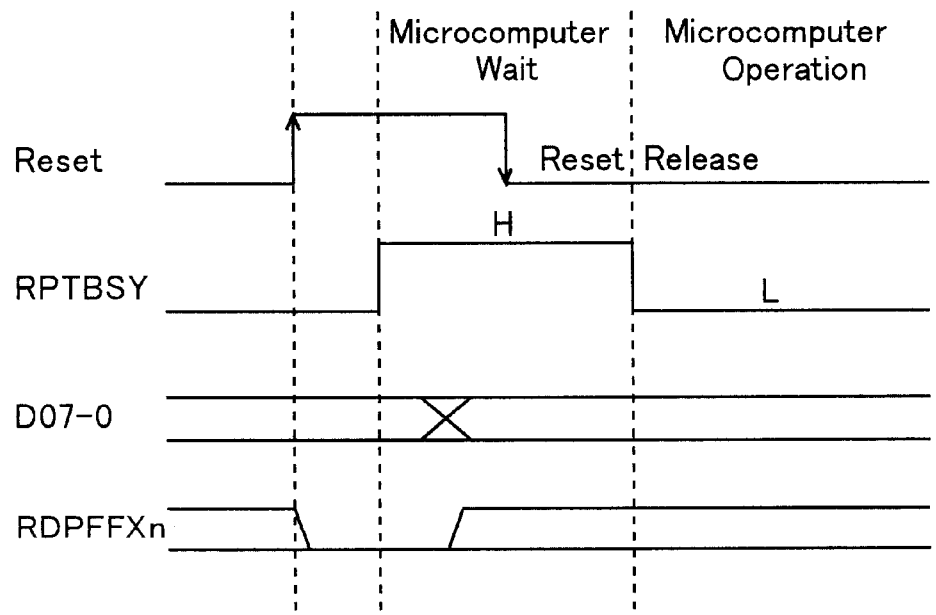
FIG. 3 is an operational timing chart of the read protection circuit of the nonvolatile memory according to the embodiment of the invention.
Figure 4:
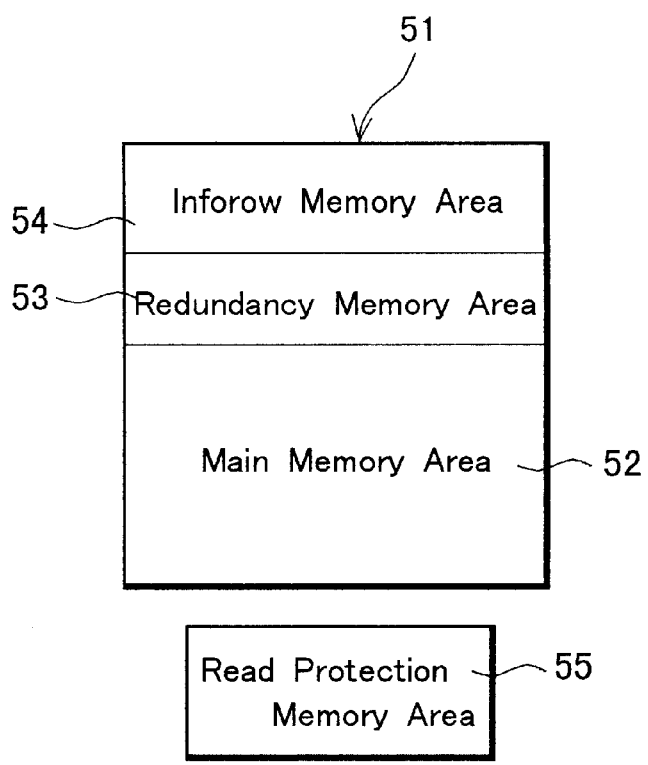
FIG. 4 is a block circuit diagram showing a read protection circuit of nonvolatile memory according to a conventional example.

Next, operations of the read protection circuit of the nonvolatile memory with the configuration mentioned above will be described with reference to FIG. 2 and an operational timing chart shown in FIG. 3. First, writing operations of read protection data will be described.

When a read protection enable signal RPTEN becomes "H", the read protection control circuit 8 outputs a control signal to the address control circuit 12. Then, the address control circuit 12 selects the read protection memory area 4. Thus, desired read protection data is written into this read protection memory area 4. The writing of this read protection data is performed by a user. However, it is constructed so that the user can bring about a read protected state but cannot bring about a read unprotected state without erasing the main memory area 2. This is performed for the purpose of data protection. A method of bringing about the read unprotected state is only a method by a test mode which is not opened for users.

A microcomputer with built-in EEPROM is in a read unprotected state (for example, a state in which the read protection memory area 4 is erased) at the time of shipment to a user and thereafter, the user writes the read protection data by the method described above. In the case that the user previously desires a microcomputer with a read protected state, the read protection data can be written by the maker at the time of testing of a wafer.

Next, readout operations of read protection data will be described. The read protection control circuit 8 outputs "H" of a read protection busy signal RPTBSY when detecting a system reset signal SYSRES of the microcomputer or a power-on reset signal POR. The system reset circuit 9 sets the microcomputer in a wait state according to "H" of the RPTBSY. Also, the read protection control circuit 8 outputs a control signal REN to the ring oscillator 10, and the ring oscillator 10 generates a clock CK used in readout of the read protection data.

Further, the read protection control circuit 8 outputs a read protection control signal to the read protection memory area 4. In accordance with the read protection control signal, read protection data D07-0 is automatically read from the read protection memory area 4. Then, the read protection control circuit 8 provides a register control signal (latch signal) for the read protection register 11. The read protection data D07-0 read from the protection memory area 4 is latched by the read protection register 11, and is temporarily stored in the read protection register 11. Thereafter, the read protection control circuit 8 outputs "L" of the RPTBSY as an operation enable signal. As a result of this, the microcomputer becomes an operation enable state.

When a data output RDPFFXn of the read protection register 11 is "L", an output of the AND gate 15 is fixed at an L level and read protection is provided. That is, even when a predetermined address of the main memory 2 is selected and program data is outputted and a flash mode signal FLM is "H", the data is not outputted to the output port 13. Program data from the main memory area 2 is inputted to the CPU 14 and the CPU 14 operates according to the program data.

Incidentally, also with readout of redundancy address data stored in the redundancy address memory area 5, repair on the defective memory area occurring in the main memory area 2 can be made by sharing the read protection control circuit 8, the read protection register 11 and the address control circuit 12 described above. In this case, a circuit for comparing redundancy address data read to the read protection register 11 with input address data and detecting a match between both the data is added.

In accordance with the read protection circuit of the nonvolatile memory described above, the read protection memory area 4 is formed within the same memory mat as the main memory area 2, so that the need to provide a dedicated analog control circuit as a conventional example is eliminated and a chip size can be reduced considerably.

Also, a size of the read protection memory area 4 can be changed easily, so that memory design according to specifications of a type of machine can be performed in a short time while the chip size can be reduced.

Also, a system reset signal SYSRES or a power-on reset signal is used as a trigger signal of readout of read protection data, so that synchronization with operations of the microcomputer can be ensured easily.

Incidentally, in the embodiment, the description has been made taking the microcomputer with built-in EEPROM as an example, but the invention is not limited to this and can widely be applied to systems with built-in EEPROM.

As described above, in accordance with a redundancy memory circuit of the invention, a read protection memory area is formed within the same memory mat as a main memory area, so that the need to dedicatedly provide a dedicated EEPROM cell for storing read protection data and an analog control circuit for writing the read protection data into this EEPROM cell is eliminated and a chip size can be reduced.

Also, a size of the read protection memory area can be changed easily, so that memory design according to specifications of a type of machine can be performed in a short time while the chip size can be reduced.

Further, when a redundancy memory circuit of the invention is built in a microcomputer as a circuit IP to become system LSI, synchronization with system operations can be obtained surely.

What is claimed is:

1. A read protection circuit of nonvolatile memory, comprising:
    a main memory area including nonvolatile memories capable of electrically writing and reading, and the main memory area is provided in a memory mat;
    a read protection memory area provided within the same memory mat as the main memory area;
    a writing unit for writing read protection data including information as to whether read protection is provided into the read protection memory area;
    a reading unit for reading the read protection data stored in the read protection memory area according to a trigger signal,
    a register for temporarily storing the read protection data read from the read protection memory area; and
    a gate for setting a data output read from the main memory area in a read protected state according to output data of the register.

2. A read protection circuit of nonvolatile memory, comprising:
    a main memory area including nonvolatile memories capable of electrically writing and reading, and the main memory area is provided in a memory mat;
    a read protection memory area which is provided within the same memory mat as the main memory area and stores read protection data including information as to whether read protection is provided,
    a read protection control circuit for outputting a control signal for reading the read protection data stored in the read protection memory area according to a trigger signal,
    a register for temporarily storing the read protection data read from the read protection memory area, and
    a gate for setting a data output read from the main memory area in a read protected state according to output data of the register.

3. A read protection circuit of nonvolatile memory according to claim 2,
    wherein the read protection memory area is provided in a same address space as the main memory area.

4. A read protection circuit of nonvolatile memory according to claim 2,
    wherein the read protection control circuit detects a reset of a microcomputer and outputs a control signal for reading the read protection data stored in the read protection memory area.

5. A read protection circuit of nonvolatile memory according to claim 4,
    wherein the read protection control circuit outputs a read protection busy signal for detecting a reset of a microcomputer to set the microcomputer in a standby state and also outputs an operation enable signal for setting the microcomputer in an operating state after reading the read protection data stored in the read protection memory area.

* * * * *